US012723299B2

(12) United States Patent
Lee et al.

(10) Patent No.: US 12,723,299 B2
(45) Date of Patent: Sep. 1, 2026

(54) MASK ASSEMBLY AND, APPARATUS AND METHOD OF MANUFACTURING DISPLAY APPARATUS

(71) Applicant: Samsung Display Co., Ltd., Yongin-si (KR)

(72) Inventors: Seungjin Lee, Yongin-si (KR); Sanghoon Kim, Yongin-si (KR); Jaesuk Moon, Yongin-si (KR); Jongsung Park, Yongin-si (KR); Junghyun Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 822 days.

(21) Appl. No.: 17/512,224

(22) Filed: Oct. 27, 2021

(65) Prior Publication Data

US 2022/0344624 A1 Oct. 27, 2022

(30) Foreign Application Priority Data

Apr. 21, 2021 (KR) ........................ 10-2021-0051828

(51) Int. Cl.
*C23C 14/04* (2006.01)
*C23C 16/04* (2006.01)
*H10K 71/16* (2023.01)
*H10K 59/122* (2023.01)

(52) U.S. Cl.
CPC .......... *C23C 14/042* (2013.01); *C23C 16/042* (2013.01); *H10K 71/166* (2023.02); *H10K 59/122* (2023.02)

(58) Field of Classification Search
CPC .... H10K 59/122; H10K 71/00; H10K 71/166; C23C 16/042
USPC .......................................................... 118/720
See application file for complete search history.

(56) References Cited

U.S. PATENT DOCUMENTS

| | | | | |
|---|---|---|---|---|
| 9,004,002 | B2 | 4/2015 | Park et al. | |
| 9,530,961 | B2 | 12/2016 | Yi et al. | |
| 10,186,662 | B2 | 1/2019 | Kim | |
| 10,873,028 | B2 | 12/2020 | Kim et al. | |
| 11,414,739 | B2 * | 8/2022 | Lin | C23C 14/12 |
| 2007/0006807 | A1 | 1/2007 | Manz | |
| 2015/0037928 | A1 | 2/2015 | Hirobe et al. | |

(Continued)

FOREIGN PATENT DOCUMENTS

| | | | |
|---|---|---|---|
| CN | 1861833 | A | 11/2006 |
| CN | 105322103 | A | 2/2016 |

(Continued)

OTHER PUBLICATIONS

Office Action for Chinese Application No. 202210305738.3 dated Apr. 22, 2026. 6 pgs.

*Primary Examiner* — Charlee J. C. Bennett
(74) *Attorney, Agent, or Firm* — Lerner David LLP

(57) ABSTRACT

An apparatus for manufacturing a display apparatus includes a mask assembly; and a first magnet and a second magnet facing the mask assembly, the mask assembly includes a mask frame including an opening; and a mask sheet disposed on the mask frame, the mask sheet includes a first body portion including first openings; and a second body portion connected to the first body portion and including second openings, and the second body portion overlaps at least a portion of the first magnet and the second magnet.

13 Claims, 11 Drawing Sheets

(56) References Cited

U.S. PATENT DOCUMENTS

| | | | | |
|---|---|---|---|---|
| 2016/0248049 | A1* | 8/2016 | Hong | C23C 14/042 |
| 2017/0222145 | A1* | 8/2017 | Kim | H10K 71/00 |
| 2019/0100834 | A1* | 4/2019 | Sakio | C23C 14/042 |
| 2019/0305222 | A1 | 10/2019 | Jung et al. | |
| 2019/0378983 | A1* | 12/2019 | Kim | H10K 71/00 |
| 2020/0232091 | A1 | 7/2020 | Ahn et al. | |
| 2020/0251656 | A1 | 8/2020 | Kim | |
| 2021/0108303 | A1 | 4/2021 | Ahn et al. | |
| 2022/0344624 | A1 | 10/2022 | Lee et al. | |

FOREIGN PATENT DOCUMENTS

| | | | |
|---|---|---|---|
| CN | 111519134 | A | 8/2020 |
| CN | 112662991 | A | 4/2021 |
| CN | 217922277 | U | 11/2022 |
| JP | 2005339861 | A | 12/2005 |
| KR | 10-2016-0033337 | | 3/2016 |
| KR | 10-2016-0104194 | | 9/2016 |
| KR | 10-2017-0091243 | | 8/2017 |
| KR | 20190141058 | A | 12/2019 |
| KR | 10-2020-0091052 | | 7/2020 |

* cited by examiner

FIG. 4

MASK ASSEMBLY AND, APPARATUS AND METHOD OF MANUFACTURING DISPLAY APPARATUS

CROSS-REFERENCE TO RELATED APPLICATION(S)

This application claims priority to and benefits of Korean Patent Application No. 10-2021-0051828 under 35 U.S.C. § 119, filed on Apr. 21, 2021, in the Korean Intellectual Property Office, the entire contents of which are incorporated herein by reference.

BACKGROUND

1. Technical Field

One or more embodiments relate to an apparatus and a method, and, to a mask assembly and, an apparatus and a method of manufacturing a display apparatus.

2. Description of the Related Art

Mobile electronic apparatuses are widely used. In addition to miniaturized electronic apparatuses such as mobile phones, tablet personal computers (PCs) as mobile electronic apparatuses have been recently widely used.

To support various functions, the mobile electronic apparatuses include a display apparatus to provide a user with visual information such as an image. Recently, because parts driving a display apparatus are miniaturized, the proportion of the display apparatus in an electronic apparatus gradually increases and a structure that may be bent into an angle from a flat state is also under development.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Generally, for deposition of a precise pattern while a display apparatus is manufactured, a display substrate may be closely attached to a mask assembly including a mask sheet by using a magnet, for example. Due to an effective volume difference existing inside the mask sheet, a repulsive force may be generated by magnetic force, and a deposition accuracy may be reduced due to the repulsive force.

Accordingly, one or more embodiments include a mask assembly with an improved deposition accuracy of a manufacturing apparatus, and, a method of manufacturing a display apparatus having a precise pattern, and an apparatus and a method of manufacturing a display apparatus. However, such technical problems are an example, and the disclosure is not limited thereto.

Additional aspects will be set forth in part in the description which follows and, in part, will be apparent from the description, or may be learned by practice of the disclosure.

According to one or more embodiments, an apparatus for manufacturing a display apparatus may include a mask assembly; and a first magnet and a second magnet facing the mask assembly, wherein the mask assembly may include a mask frame including an opening; and a mask sheet disposed on the mask frame, the mask sheet may include a first body portion including first openings; and a second body portion connected to the first body portion and including second openings, and the second body portion overlaps at least a portion of the first magnet and the second magnet.

The first magnet may be spaced apart from the second magnet in a lengthwise direction of the mask sheet.

The mask assembly may include a support frame extending in a direction intersecting the lengthwise direction of the mask sheet and supporting the mask sheet.

The second body portion may overlap at least a portion of the support frame in a plan view.

Areas of the first openings may be different from areas of the second openings in a plan view.

A number of the first openings of the first body portion per unit area of an upper surface of the first body portion may be greater than a number of the second openings of the second body portion per unit area of an upper surface of the second body portion.

The mask sheet may include a third body portion connected to the first body portion and including third openings.

The third body portion may not overlap the support frame.

A number of the third openings of the third body portion per unit area of an upper surface of the third body portion may be equal to a number of second openings of the second body portion per unit area of an upper surface of the second body portion.

The second body portion and the third body portion may be disposed on a straight line.

The second body portion may have a first width in the lengthwise direction of the mask sheet, and the third body portion may have a second width in the lengthwise direction of the mask sheet that is less than the first width of the second body portion.

According to one or more embodiments, a mask assembly may include a mask frame including an opening; a mask sheet disposed on the mask frame; and a support frame extending in a direction intersecting a lengthwise direction of the mask sheet, the support frame supporting the mask sheet, wherein the mask sheet may include a first body portion including first openings; and a second body portion connected to the first body portion and including second openings, and the second body portion overlaps at least a portion of the support frame in a plan view.

Areas of the first openings may be different from areas of the second openings in a plan view.

A number of the first openings of the first body portion per unit area of an upper surface of the first body portion may be greater than a number of the second openings of the second body portion per unit area of an upper surface of the second body portion.

The mask sheet may include a third body portion connected to the first body portion and including third openings.

The third body portion may not overlap the support frame in a plan view.

The second body portion may have a first width in the lengthwise direction of the mask sheet, and the third body portion may have a second width in the lengthwise direction of the mask sheet that is less than the first width of the second body portion.

According to one or more embodiments, a method of manufacturing a display apparatus may include disposing a display substrate and a mask assembly inside of a chamber; and depositing a deposition material on the display substrate through the mask assembly, wherein the mask assembly may include a mask frame including an opening; a mask sheet disposed on the mask frame; and a support frame extending in a direction intersecting a lengthwise direction of the mask sheet and supporting the mask sheet, the mask sheet may include a first body portion including first openings; and a second body portion connected to the first body portion and including second openings, and the second body portion overlaps at least a portion of the support frame in a plan view.

The mask sheet may include a third body portion connected to the first body portion and including third openings.

The second body portion may have a first width in the lengthwise direction of the mask sheet, and the third body portion may have a second width in the lengthwise direction of the mask sheet that is less than the first width of the second body portion.

These and/or other aspects will become apparent and more readily appreciated from the following description of the embodiments, the accompanying drawings, and the claims.

BRIEF DESCRIPTION OF THE DRAWINGS

The above and other aspects, features, and advantages of embodiments of the disclosure will be more apparent from the following description taken in conjunction with the accompanying drawings, in which:

FIG. 4 is a schematic cross-sectional view of a display apparatus according to an embodiment, taken along lines II-II' and III-III' of FIG. 3;

DETAILED DESCRIPTION OF THE EMBODIMENTS

Figure 1:
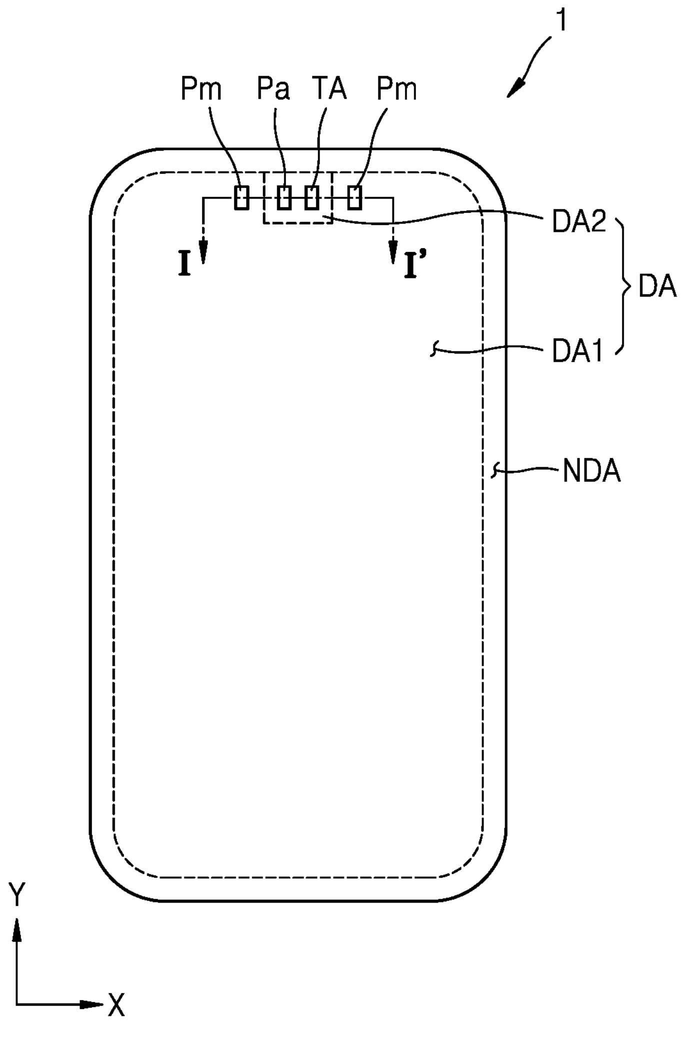
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The singular forms "a," "an," and "the" as used herein are intended to include the plural forms as well unless the context clearly indicates otherwise.

It will be understood that the terms "comprise," "comprising," "include" and/or "including" and variations thereof as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, intervening layers, regions, or components may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Sizes of elements in the drawings may be exaggerated or reduced for convenience of explanation. For example, since sizes and thicknesses of elements in the drawings may be arbitrarily illustrated for convenience of explanation, the disclosure is not limited thereto.

In the specification, "A and/or B" means A or B, or A and B. In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, when a wiring is referred to as "extending in a first direction or a second direction", it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" may also include overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments are described in detail with reference to the accompanying drawings. When description is made with reference to the drawings, like reference numerals are used for like or corresponding elements.

FIG. 1 is a schematic perspective view of a display apparatus 1 according to an embodiment.

The display apparatus 1 may include an apparatus for displaying moving images or still images and may be used as a display screen of various products including televisions, notebook computers, monitors, advertisement boards, Internet of things (IOT) as well as portable electronic apparatuses including mobile phones, smartphones, tablet personal computers (PC), mobile communication terminals, electronic organizers, electronic books, portable multimedia players (PMP), navigations, and ultra mobile personal computers (UMPC). The display apparatus 1 may be used in wearable apparatuses including smartwatches, watchphones, glasses-type displays, and head-mounted displays (HMD). The display apparatus 1 may be used as instrument panels for automobiles, center fascias for automobiles, or center information displays (CID) arranged or disposed on a dashboard, room mirror displays that replace side mirrors of automobiles, and displays arranged or disposed on the backside of front seats as entertainment for back seats of automobiles. FIG. 1 shows, for convenience of description, that the display apparatus 1 is used as a smartphone.

Referring to FIG. 1, the display apparatus 1 may include a display area DA and a non-display area NDA outside of or adjacent to the display area DA. The display apparatus 1 may display an image through an array of pixels two-dimensionally arranged or disposed in the display area DA.

The non-display area NDA is a region that does not display an image and may surround or may be adjacent to the display area DA entirely. A driver, for example, may be arranged or disposed in the non-display area NDA, the driver, for example, to provide electric signals or power to display elements arranged or disposed in the display area DA. A pad may be arranged or disposed in the non-display area NDA, the pad being a region to which electronic elements or a printed circuit board may be electrically connected.

The display area DA may include a first display area DA1 and a second display area DA2. Main sub-pixels Pm may be arranged or disposed in the first display area DA1 and auxiliary sub-pixels Pa may be arranged or disposed in the second display area DA2. The display apparatus 1 may display an image by using light emitted from the main sub-pixels Pm arranged or disposed in the first display area DA1 and display an auxiliary image by using light emitted from the auxiliary sub-pixels Pa arranged or disposed in the second display area DA2.

As described below with reference to FIG. 2, the second display area DA2 may be a region below which a component 20 (see FIG. 2) such as a sensor that uses an infrared ray, a visible ray, or sound, for example, may be arranged or disposed. The second display area DA2 may include a transmission area TA through which light and/or sound output from the component 20 to the outside or progressing toward the component 20 from the outside may pass. In an embodiment, in the case where light passes through the second display area DA2, a light transmittance may be about 30% or more, for example, about 50% or more, about 75% or more, about 80% or more, about 85% or more, or about 90% or more.

A resolution of an image displayed by the second display area DA2 may be less than the resolution of an image displayed by the first display area DA1. For example, because the second display area DA2 may include the transmission area TA through which light and/or sound may pass, the number of auxiliary sub-pixels Pa per unit area of the second display area DA2 may be less than the number of main sub-pixels Pm per unit area of the first display area DA1.

In an embodiment, the second display area DA2 may be arranged or disposed on one side or on a side of the first display area DA1. It is shown in FIG. 1 that the second display area DA2 is arranged or disposed on the upper center of the first display area DA1 such that the second display area DA2 is partially surrounded by the first display area DA1. However, an embodiment is not limited thereto. The second display area DA2 may be arranged or disposed on the left of the first display area DA1 such that the second display area DA2 is arranged or disposed between the non-display area NDA and the first display area DA1.

Hereinafter, though an organic light-emitting display apparatus is described as an example of the display apparatus 1 according to an embodiment, an embodiment is not limited thereto. In an embodiment, various display apparatuses such as inorganic light-emitting display apparatuses and quantum-dot light-emitting display apparatuses may be used.

Figure 2:
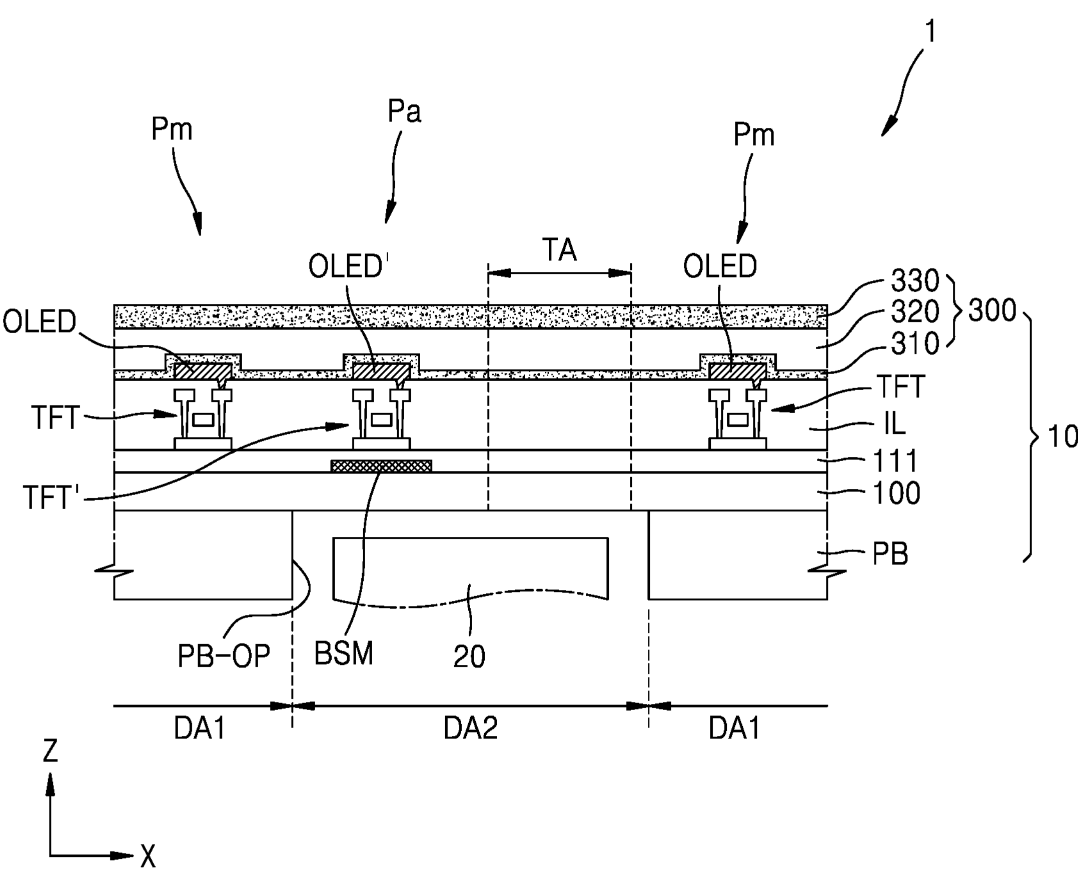
FIG. 2 is a schematic cross-sectional view of a display apparatus according to an embodiment, taken along line I-I' of FIG. 1.

FIG. 2 is a schematic cross-sectional view of a display apparatus according to an embodiment, taken along line I-I' of FIG. 1.

Referring to FIG. 2, the display apparatus 1 may include a display panel 10 and the component 20, the display panel 10 including a display element, and the component 20 overlapping the display panel 10. The component 20 may be arranged or disposed below the display panel 10 and arranged or disposed in the second display area DA2.

The display panel 10 may include a substrate 100, thin-film transistors TFT and TFT', display elements (for example, organic light-emitting diodes OLED and OLED'), and an encapsulation layer 300, the thin-film transistors TFT and TFT' being arranged or disposed over the substrate 100, the display elements being electrically connected to the thin-film transistors TFT and TFT', and the encapsulation layer 300 covering or overlapping the display elements. The display panel 10 may further include a lower protection film PB arranged or disposed under or below the substrate 100.

The substrate 100 may include glass or a polymer resin. The substrate 100 including a polymer resin may be flexible, rollable, or bendable. The substrate 100 may have a multi-layered structure including a layer including the polymer resin and an inorganic layer (not shown).

The thin-film transistors, for example, the main and auxiliary thin-film transistors TFT and TFT' and the organic light-emitting diodes, for example, the main and auxiliary organic light-emitting diodes OLED and OLED', may be arranged or disposed over the substrate 100, the main and auxiliary organic light-emitting diodes OLED and OLED' being display elements respectively and electrically connected to the main and auxiliary thin-film transistors TFT and TFT'. The main and auxiliary organic light-emitting diodes OLED and OLED' may each emit red light, green light, or blue light.

The main sub-pixels Pm may be arranged or disposed in the first display area DA1, the main sub-pixels Pm including the main thin-film transistor TFT and the main organic light-emitting diode OLED connected to the main thin-film transistor TFT. The auxiliary sub-pixels Pa may be arranged or disposed in the second display area DA2, the auxiliary sub-pixels Pa including the auxiliary thin-film transistor TFT' and the auxiliary organic light-emitting diode OLED' connected to the auxiliary thin-film transistor TFT'.

The transmission area TA may be arranged or disposed in the second display area DA2. The transmission area TA may be a region through which light emitted from the component 20 and/or light progressing toward the component 20 may pass. In the display panel 10, a transmittance of the transmission area TA may be about 30% or more, about 40% or more, about 50% or more, about 60% or more, about 70% or more, about 75% or more, about 80% or more, about 85% or more, or about 90% or more.

The component 20 may include a sensor such as a proximity sensor, an illuminance sensor, an iris sensor, and a face recognition sensor, and a camera (or an image sensor). The component 20 may use light. As an example, the component 20 may emit and/or receive light in infrared, ultraviolet, and visible light bands. The proximity sensor that uses an infrared ray may detect an object arranged or disposed close to the upper surface of the display apparatus 1. The illuminance sensor may detect the brightness of light incident to the upper surface of the display apparatus 1. The iris sensor may photograph the iris of a person over the upper surface of the display apparatus 1, and the camera may receive light from an object over the upper surface of the display apparatus 1.

In an embodiment, a buffer layer 111 and an insulating layer IL may be arranged or disposed between the substrate 100 and the main and auxiliary organic light-emitting diodes OLED and OLED'. The insulating layer IL may include inorganic insulating layers and/or organic insulating layers.

To prevent the function of the auxiliary thin-film transistor TFT' arranged or disposed in the second display area DA2 from being deteriorated by light passing through the transmission area TA, a bottom electrode layer BSM may be arranged or disposed between the substrate 100 and the buffer layer 111. The bottom electrode layer BSM may be arranged or disposed to correspond to the lower portion of the auxiliary thin-film transistor TFT'. The bottom electrode layer BSM may block external light reaching the auxiliary sub-pixel Pa including the auxiliary thin-film transistor TFT', for example. As an example, the bottom electrode layer BSM may block light emitted from the component 20 reaching the auxiliary sub-pixel Pa. In an embodiment, a constant voltage or a signal may be applied to the bottom electrode layer BSM and may prevent damage to a pixel circuit due to electrostatic discharge.

The bottom electrode layer BSM may be arranged or disposed in the second display area DA2 and may include an opening that overlaps the transmission area TA. Accordingly, the bottom electrode layer BSM may not be arranged or disposed in the transmission area TA. The bottom electrode layer BSM may not be arranged or disposed in the first display area DA1.

The encapsulation layer 300 may cover or overlap the main and auxiliary organic light-emitting diodes OLED and OLED'. The encapsulation layer 300 may include at least one inorganic layer and at least one organic layer. In an embodiment, the encapsulation layer 300 may include a first inorganic layer 310, a second inorganic layer 330, and an organic layer 320 therebetween.

The first inorganic layer 310 and the second inorganic layer 330 may include at least one inorganic insulating material from among aluminum oxide, titanium oxide, tantalum oxide, hafnium oxide, zinc oxide, silicon oxide, silicon nitride, and silicon oxynitride. The organic layer 320 may include a polymer-based material. The polymer-based material may include an acryl-based resin, an epoxy-based resin, polyimide, and polyethylene.

The lower protection film PB may be attached to the lower surface of the substrate 100 to support and protect the substrate 100. The lower protection film PB may include an opening PB-OP corresponding to the second display area DA2. Because the lower protection film PB may include the opening PB-OP, a light transmittance of the second display area DA2 may be improved. The lower protection film PB may include polyethylene terephthalate (PET) or polyimide (PI).

The area of the second display area DA2 may be greater than the area in which the component 20 may be arranged or disposed. Accordingly, the area of the opening PB-OP of the lower protection film PB may not coincide with the area of the second display area DA2. As an example, the area of the opening PB-OP may be less than the area of the second display area DA2.

Components 20 may be arranged or disposed in the second display area DA2. The components 20 may perform different functions. As an example, one of the components 20 may be a camera, and another may be an infrared sensor.

Though not shown, elements such as an input sensing member, an anti-reflection member, and a transparent window may be further arranged or disposed on the display panel 10, the input sensing member sensing a touch input, the anti-reflection member including a polarizer and a retarder, or color filters and a black matrix, by way of example.

Though it is shown in FIG. 2 that the encapsulation layer 300 is used as an encapsulation member that seals the main and auxiliary organic light-emitting diodes OLED and OLED', an embodiment is not limited thereto. As an example, as the encapsulation member that seals the main and auxiliary organic light-emitting diodes OLED and OLED', a sealing substrate that may be attached to the substrate 100 through sealant or frit may be used.

Figure 3:
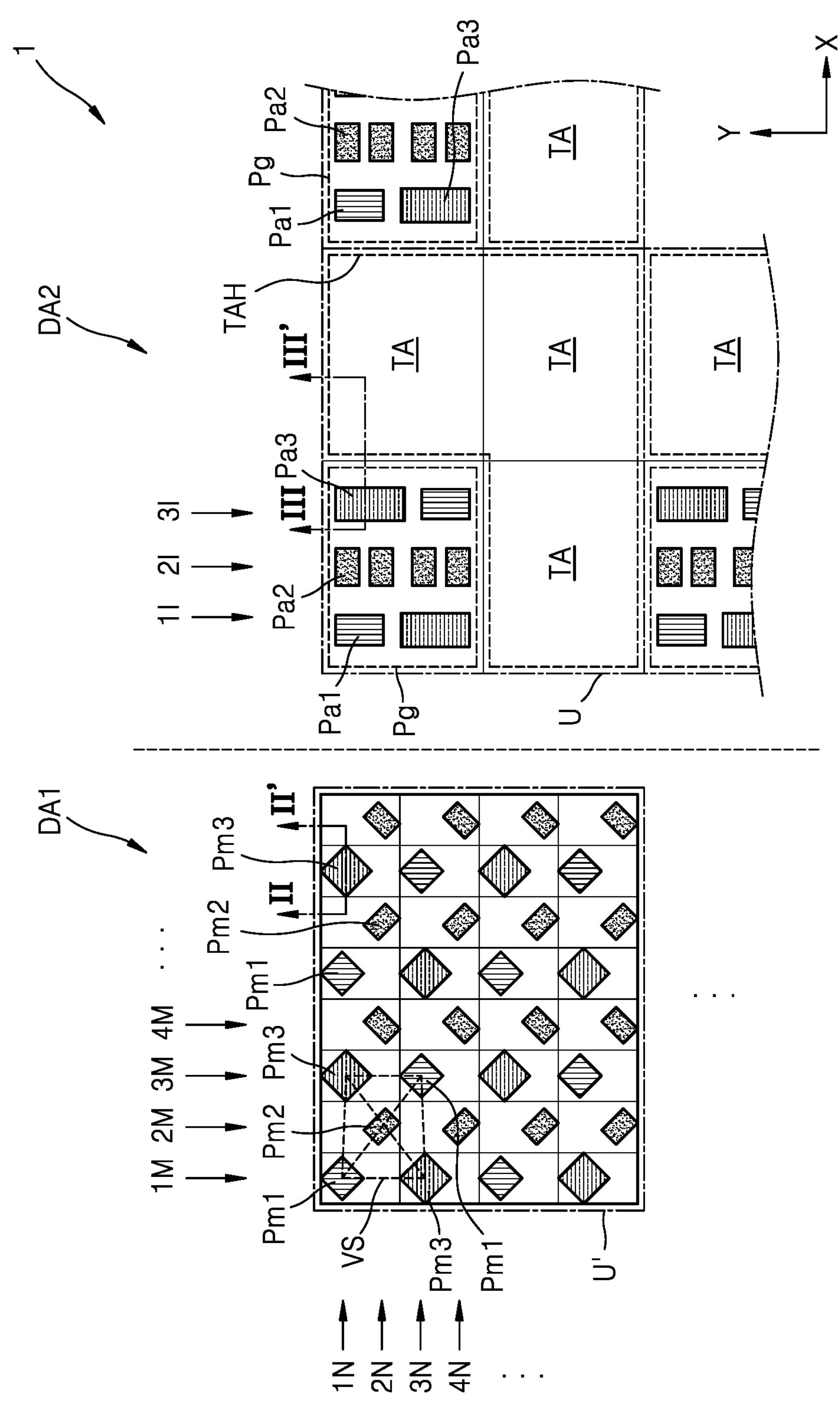
FIG. 3 is a schematic plan view of configurations of sub-pixels and a transmission area arranged or disposed in a first display area and a second display area of a display apparatus according to an embodiment.

FIG. 3 is a schematic plan view of configurations of sub-pixels and the transmission area TA arranged or disposed in the first display area DA1 and the second display area DA2 of the display apparatus 1 according to an embodiment.

Referring to FIG. 3, main sub-pixels, for example, first to third main sub-pixels Pm1, Pm2, and Pm3, may be arranged or disposed in the first display area DA1 of the display apparatus 1 according to an embodiment. A pixel group Pg including auxiliary sub-pixels, for example, first to third auxiliary sub-pixels Pa1, Pa2, and Pa3, and the transmission area TA may be arranged or disposed in the second display area DA2.

In an embodiment, the main sub-pixels, for example, the first to third main sub-pixels Pm1, Pm2, and Pm3, arranged or disposed in the first display area DA1 may be arranged or disposed in a structure different from that of the auxiliary sub-pixels, for example, the first to third auxiliary sub-pixels Pa1, Pa2, and Pa3, arranged or disposed in the second display area DA2. In the specification, the configuration structure of pixels is described based on an emission area of each sub-pixel. An emission area of a sub-pixel may be defined by an opening of a pixel-defining layer, which is described below.

As shown in FIG. 3, the main sub-pixels, for example, the first to third main sub-pixels Pm1, Pm2, and Pm3, arranged or disposed in the first display area DA1 may be arranged or disposed in a PENTILE' structure. The first main sub-pixel Pm1, the second main sub-pixel Pm2, and the third main sub-pixel Pm3 may implement different colors. As an example, the first main sub-pixel Pm1, the second main sub-pixel Pm2, and the third main sub-pixel Pm3 may respectively implement red, green, and blue colors.

The first main sub-pixels Pm1 and the third main sub-pixels Pm3 may be alternately arranged or disposed on a first row 1N, the second main sub-pixels Pm2 may be apart from each other with a preset interval on a second row 2N adjacent to the first row 1N, the third main sub-pixels Pm3 and the first main sub-pixels Pm1 may be alternately arranged or disposed on a third row 3N adjacent to the second row 2N, and the second main sub-pixels Pm2 may be apart from each other on a fourth row 4N adjacent to the third row 3N. Such a configuration of the pixels is repeated up to an N-th row. The third main sub-pixels Pm3 and the first main sub-pixels Pm1 may be greater in size than the second main sub-pixels Pm2.

The first main sub-pixels Pm1 and the third main sub-pixels Pm3 arranged or disposed on the first row 1N may be alternately arranged or disposed with the second main sub-pixels Pm2 arranged or disposed on the second row 2N. Accordingly, the first main sub-pixels Pm1 and the third main sub-pixels Pm3 may be alternately arranged or disposed on a first column 1M, the second main sub-pixels Pm2 may be apart from each other with a preset interval on a second column 2M adjacent to the first column 1M, the third main sub-pixels Pm3 and the first main sub-pixels Pm1 may be alternately arranged or disposed on a third column 3M adjacent to the second column 2M, and the second main sub-pixels Pm2 may be apart from each other on a fourth column 4M adjacent to the third column 3M. Such a configuration of the pixels is repeated up to an M-th column.

Such a pixel configuration structure may be expressed, in which: the first main sub-pixels Pm1 are respectively arranged or disposed on first and third vertexes among the vertexes of a virtual quadrangle VS with the second main sub-pixel Pm2 centered at the center of the quadrangle, and the third main sub-pixels Pm3 are respectively arranged or disposed on second and fourth vertexes, which are the rest of the vertexes. The virtual quadrangles VS may be variously modified such as a rectangle, a rhombus, and a square.

This pixel configuration structure is referred to as a PENTILE™ matrix structure. By applying a rendering operation, in which a color of a pixel is represented by sharing the colors of its adjacent pixels, a high resolution may be obtained via a small number of pixels.

The auxiliary sub-pixels, for example, the first to third auxiliary sub-pixels Pa1, Pa2, and Pa3, arranged or disposed in the second display area DA2 may be arranged or disposed in a structure and a shape different from those of the main sub-pixels, for example, the first to third main sub-pixels Pm1, Pm2, and Pm3. The first auxiliary sub-pixel Pa1, the second auxiliary sub-pixel Pa2, and the third auxiliary sub-pixel Pa3 may respectively implement different colors. As an example, the first auxiliary sub-pixel Pa1, the second auxiliary sub-pixel Pa2, and the third auxiliary sub-pixel Pa3 may respectively implement red, green, and blue colors.

The first auxiliary sub-pixel Pa1 and the third auxiliary sub-pixel Pa3 may be sequentially arranged or disposed in a line on a first column 11, the second auxiliary sub-pixels Pa2 may be sequentially arranged or disposed in a line on a second column 21 adjacent to the first column 11, and the third auxiliary sub-pixel Pa3 and the first auxiliary sub-pixel Pa1 may be sequentially arranged or disposed in a line on a third column 31 adjacent to the second column 21. The first auxiliary sub-pixel Pa1 in the first column 11 may be opposite to the third auxiliary sub-pixel Pa3 in the third column 31.

The first auxiliary sub-pixel Pa1, the second auxiliary sub-pixel Pa2, and the third auxiliary sub-pixel Pa3 may constitute a pixel group Pg. Though it is shown in FIG. 3 that one pixel group Pg may include eight auxiliary sub-pixels, for example, the first auxiliary sub-pixels Pa1, the second auxiliary sub-pixels Pa2, and the third auxiliary sub-pixels Pa3, an embodiment is not limited thereto, and the number of auxiliary sub-pixels, for example, the first auxiliary sub-pixels Pa1, the second auxiliary sub-pixels Pa2, and the third auxiliary sub-pixels Pa3 may be variously changed.

The transmission area TA is a region in which display elements are not arranged or disposed, and thus, has a high light transmittance. Transmission areas TA may be provided or disposed in the second display areas DA2. The transmission areas TA may be alternately arranged or disposed with the pixel groups Pg in an X-direction and a Y-direction. By way of example, the transmission areas TA may surround the pixel group Pg.

A configuration of a basic unit U in which the pixel groups Pg and the transmission areas TA may be bound may be repeatedly arranged or disposed in the second display area DA2 in the X-direction and the Y-direction.

In FIG. 3, the basic unit U may have a shape that binds one pixel group Pg and the transmission areas TA therearound in a substantially quadrangular shape. The basic unit U defines a repeated shape and does not mean disconnection of the configuration. As an example, the transmission area TA included in one basic unit U may be formed as one body with another transmission area TA included in a basic unit U that may be adjacent thereto.

In an embodiment, in the basic unit U, the area of the pixel group Pg may be less than the area of the transmission area TA. As an example, the area of the pixel group Pg may be about ⅓ of the area of the transmission area TA. In other words, the area of the pixel group Pg may be about ¼ of the area of the basic unit U, and the area of the transmission area TA may be about ¾ of the area of the basic unit U.

A corresponding unit U' may be set in the first display area DA1, the corresponding unit U' having a same area as that of the basic unit U. The number of main sub-pixels, for example, the first auxiliary sub-pixels Pa1, the second auxiliary sub-pixels Pa2, and the third auxiliary sub-pixels Pa3 may be greater than the number of auxiliary sub-pixels, for example, the first auxiliary sub-pixels Pa1, the second auxiliary sub-pixels Pa2, and the third auxiliary sub-pixels Pa3 included in the basic unit U.

Figure 4:
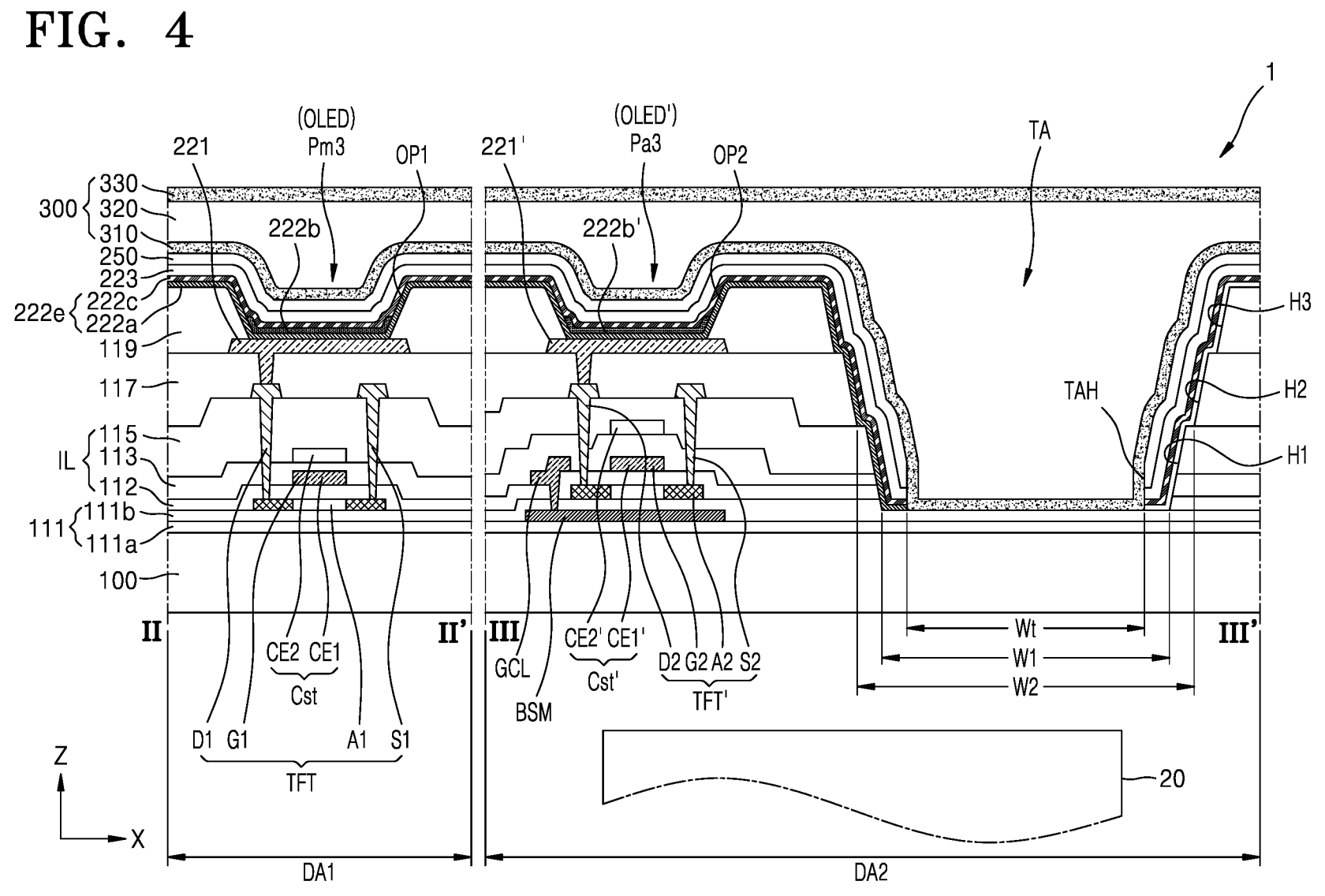

FIG. 4 is a schematic cross-sectional view of a display apparatus according to an embodiment, taken along lines II-II' and III-III' of FIG. 3.

Referring to FIG. 4, the third main sub-pixel Pm3 may be arranged or disposed in the first display area DA1, and the third auxiliary sub-pixel Pa3 and the transmission area TA may be arranged or disposed in the second display area DA2. The third main sub-pixel Pm3 and the third auxiliary sub-pixel Pa3 may be sub-pixels that implement a same color. As an example, the third main sub-pixel Pm3 and the third auxiliary sub-pixel Pa3 may implement a blue color.

The main sub-pixel Pm may include a main thin-film transistor TFT, a main storage capacitor Cst, and a main organic light-emitting diode OLED. The auxiliary sub-pixel Pa may include an auxiliary thin-film transistor TFT', an auxiliary storage capacitor Cst', and an auxiliary organic light-emitting diode OLED'. The transmission area TA may include an opening area TAH.

The component 20 may be arranged or disposed below the second display area DA2. The component 20 may be a camera that captures an image or an infrared (IR) sensor that transmits or receives an infrared ray.

Because the transmission area TA is provided in the second display area DA2, light that is transmitted or received from or to the component 20 may pass through the second display area DA2. As an example, light emitted from the component 20 may progress in a +Z-direction through the transmission area TA, and light that is generated from the outside of the display apparatus and is incident to the component 20 may progress in a (−) Z-direction through the transmission area TA. In an embodiment, the component 20 may include image sensors, in which one image sensor may correspond to one transmission area TA.

Hereinafter, a structure in which elements of the display apparatus 1 according to an embodiment may be stacked each other is described.

The substrate 100 may include glass or a polymer resin. The polymer resin may include polyethersulfone, polyarylate, polyetherimide, polyethylene naphthalate, polyethylene terephthalate, polyphenylene sulfide, polyimide, polycarbonate, or cellulose acetate propionate. The substrate 100 including the polymer resin is flexible, rollable, or bendable. The substrate 100 may have a multi-layered structure including a layer and an inorganic layer (not shown), the layer including the polymer resin.

A buffer layer 111 may be arranged or disposed on the substrate 100 to reduce or block the penetration of foreign substance, moisture, or external air from below the substrate 100 and may provide a flat surface on the substrate 100. The buffer layer 111 may include an inorganic material including oxide or nitride, an organic material, or an organic and inorganic composite material, and have a single-layered structure or a multi-layered structure of an inorganic material and an organic material. A barrier layer (not shown) may be further provided between the substrate 100 and the buffer layer 111, the barrier layer blocking the penetration of external air. In an embodiment, the buffer layer 111 may include silicon oxide ($SiO_2$) or silicon nitride ($SiN_x$). The buffer layer 111 may include a first buffer layer 111*a* and a second buffer layer 111*b* that may be stacked each other.

The bottom electrode layer BSM may be arranged or disposed between the first buffer layer 111*a* and the second buffer layer 111*b* in the second display area DA2. In an embodiment, the bottom electrode layer BSM may be arranged or disposed between the substrate 100 and the first buffer layer 111*a*. The bottom electrode layer BSM may be arranged or disposed below the auxiliary thin-film transistor TFT' to prevent the characteristics of the auxiliary thin-film transistor TFT' from being deteriorated due to light emitted from the component 20.

The bottom electrode layer BSM may be connected to a wiring GCL arranged or disposed on a different layer than the one on which the bottom electrode layer BSM may be arranged or disposed through a contact hole and may receive a constant voltage or a signal from the wiring GCL. As an example, the bottom electrode layer BSM may receive a driving voltage or a scan signal. Because the bottom electrode layer BSM receives a constant voltage or a signal, a probability that electrostatic discharge occurs may be remarkably reduced. The bottom electrode layer BSM may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu). The bottom electrode layer BSM may have a single-layered structure or a multi-layered structure.

The main thin-film transistor TFT and the auxiliary thin-film transistor TFT' may be arranged or disposed on the buffer layer 111. The main thin-film transistor TFT may include a first semiconductor layer A1, a first gate electrode G1, a second source electrode S1, and a first drain electrode D1. The auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED of the first display area DA1 to drive the main organic light-emitting diode OLED. The auxiliary thin-film transistor TFT' may be connected to the auxiliary organic light-emitting diode OLED' of the second display area DA2 to drive the auxiliary organic light-emitting diode OLED'.

The first semiconductor layer A1 and the second semiconductor layer A2 may be arranged or disposed on the buffer layer 111 and may include polycrystalline silicon. In an embodiment, the first semiconductor layer A1 and the second semiconductor layer A2 may include amorphous silicon. By way of example, the first semiconductor layer A1 and the second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may each include a channel region, a source region, and a drain region, the source region and the drain region being doped with impurities.

The second semiconductor layer A2 of the auxiliary thin-film transistor TFT' may overlap the bottom electrode layer BSM with the second buffer layer 111*b* therebetween. In an embodiment, the width of the second semiconductor layer A2 may be less than the width of the bottom electrode layer BSM, and thus, when projected in a direction perpendicular to the substrate 100, the second semiconductor layer A2 may entirely overlap the bottom electrode layer BSM.

A first gate insulating layer 112 may cover or overlap the first semiconductor layer A1 and the second semiconductor layer A2. The first gate insulating layer 112 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_X$) may include zinc oxide (ZnO) and/or zinc peroxide ($ZnO_2$). The first gate insulating layer 112 may include a single layer or a multi-layer including the inorganic insulating materials.

A first gate electrode G1 and a second gate electrode G2 may be arranged or disposed on the gate insulating layer 112 to overlap the first semiconductor layer A1 and the second semiconductor layer A2. The first gate electrode G1 and the second gate electrode G2 may include at least one of molybdenum (Mo), aluminum (Al), copper (Cu), and titanium (Ti) and have a single-layered structure or a multi-layered structure including the above materials. In an embodiment, the first gate electrode G1 and the second gate electrode G2 may include a single Mo layer.

A second gate insulating layer 113 may cover or overlap the first gate electrode G1 and the second gate electrode G2. The second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multi-layer including the inorganic insulating materials.

A first upper electrode CE2 of the main storage capacitor Cst and a second upper electrode CE2' of the auxiliary storage capacitor Cst' may be arranged or disposed on the second gate insulating layer 113.

In the first display area DA1, the first upper electrode CE2 may overlap the first gate electrode G1 therebelow. The first gate electrode G1 and the first upper electrode CE2 overlapping each other with the second gate insulating layer 113 therebetween may constitute the main storage capacitor Cst. For example, the first gate electrode G1 may serve as a first lower electrode CE1 of the main storage capacitor Cst. However, an embodiment is not limited thereto. The first lower electrode CE1 may be provided as a separate element apart from the first gate electrode G1.

In the second display area DA2, the second upper electrode CE2' may overlap the second gate electrode G2 therebelow. The second gate electrode G2 and the second upper electrode CE2' overlapping each other with the second gate insulating layer 113 therebetween may constitute the auxiliary storage capacitor Cst'. For example, the second gate electrode G2 may serve as a second lower electrode CE1' of the auxiliary storage capacitor Cst'. However, an embodiment is not limited thereto. The second lower electrode CE1' may be provided as a separate element apart from the second gate electrode G2.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) and include a single layer or a multi-layer including the above materials.

An interlayer insulating layer 115 may cover or overlap the first upper electrode CE2 and the second upper electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). Zinc oxide ($ZnO_X$) may include zinc oxide (ZnO) and/or zinc peroxide ($ZnO_2$).

Assuming the first gate insulating layer 112, the second gate insulating layer 113, and the interlayer insulating layer 115 are collectively referred to as inorganic insulating layers IL, a structure in which the inorganic insulating layers IL may be stacked each other may have a transmittance of about 90% or more with respect to an infrared wavelength. As an example, light in the wavelength band in a range of about 900 nm to about 1100 nm passing through the substrate 100 and the inorganic insulating layer IL may have a transmittance of about 90%.

The source electrodes, for example, the first and second source electrodes S1 and S2 and the drain electrodes, for example, the first and second drain electrodes D1 and D2 may be arranged or disposed on the interlayer insulating layer 115. The source electrodes, for example, the first and second source electrodes S1 and S2 and the drain electrodes, for example, the first and second drain electrodes D1 and D2 may include a conductive material including molybdenum (Mo), aluminum (Al), copper (Cu), and titanium (Ti) and include a single layer or a multi-layer including the above materials. In an embodiment, the source electrodes, for example, the first and second source electrodes S1 and S2 and the drain electrodes, for example, the first and second drain electrodes D1 and D2 may have a multi-layered structure of Ti/Al/Ti.

A planarization layer 117 may cover or overlap the source electrodes, for example, the first and second source electrodes S1 and S2 and the drain electrodes, for example, the first and second drain electrodes D1 and D2. The planarization layer 117 may have a flat upper surface such that a main pixel electrode 221 and an auxiliary pixel electrode 221' thereon are formed flat.

The planarization layer 117 may include a single layer or a multi-layer including organic materials. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The planarization layer 117 may include a via hole that exposes one of the first source electrode S1 and the first drain electrode D1 of the main thin-film transistor TFT. The main pixel electrode 221 may be electrically connected to the main thin-film transistor TFT by contacting the first source electrode S1 or the first drain electrode D1 through the via hole.

The planarization layer 117 may include a via hole that exposes one of the second source electrode S2 and the second drain electrode D2 of the auxiliary thin-film transistor TFT'. The auxiliary pixel electrode 221' may be electrically connected to the auxiliary thin-film transistor TFT' by contacting the second source electrode S2 or the second drain electrode D2 through the via hole.

The main pixel electrode 221 and the auxiliary pixel electrode 221' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the main pixel electrode 221 and the auxiliary pixel electrode 221' may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. By way of example, the main pixel electrode 221 and the auxiliary pixel electrode 221' may further include a layer on or under or below the reflective layer, the layer including ITO, IZO, ZnO, or $In_2O_3$. As an example, the main pixel electrode 221 and the auxiliary pixel electrode 221' may have a structure of ITO/Ag/ITO that may be stacked each other.

A pixel-defining layer 119 may cover or overlap the edges of each of the main pixel electrode 221 and the auxiliary pixel electrode 221'. The pixel-defining layer 119 may include a first opening OP1 and a second opening OP2 that respectively overlap the main pixel electrode 221 and the auxiliary pixel electrode 221' and define an emission area of a sub-pixel. The pixel-defining layer 119 may prevent an arc, for example, from occurring at the edges of the main pixel electrode 221 and the auxiliary pixel electrode 221' by increasing a distance between the edges of the main pixel electrode 221 and the auxiliary pixel electrode 221' and an opposite electrode 223 over the main pixel electrode 221 and the auxiliary pixel electrode 221'. The pixel-defining layer 119 may include an organic insulating material such as polyimide, polyamide, acrylic resin, benzocyclobutene, hexamethyldisiloxane (HMDSO), and phenolic resin and be formed through spin coating.

The planarization layer 117 and the pixel-defining layer 119 may have a transmittance of about 90% or more with respect to light having an infrared wavelength. As an example, light in wavelength band in a range of about 900 nm to about 1100 nm passing through the planarization layer 117 and the pixel-defining layer 119 may have a transmittance of about 90%.

A main intermediate layer (not shown) and an auxiliary intermediate layer (not shown) may be arranged or disposed in the first opening OP1 and the second opening OP2 of the pixel-defining layer 119, the main intermediate layer and the auxiliary intermediate layer respectively corresponding to the main pixel electrode 221 and the auxiliary pixel electrode 221'. The main intermediate layer may include a main emission layer **222*b*, and the auxiliary intermediate layer may include an auxiliary emission layer 222*b*'. The main emission layer 222*b* and the auxiliary emission layer 222*b*'** may include a polymer material or a low-molecular weight material and emit red, green, blue, or white light.

The main intermediate layer and/or the auxiliary intermediate layer may include an organic functional layer **222*e* on and/or under or below the main emission layer 222*b* and the auxiliary emission layer 222*b*'. The organic functional layer 222*e* may include a first functional layer 222*a* and/or a second functional layer 222*c*. The first functional layer 222*a* and/or the second functional layer 222*c*** may be omitted.

The first functional layer **222*a* may be arranged or disposed under or below the main emission layer 222*b* and the auxiliary emission layer 222*b*'. In an embodiment, like the main emission layer 222*b* and the auxiliary emission layer 222*b*', the first functional layer 222*a* may be patterned to correspond to the first opening OP1 and the second opening OP2 and arranged or disposed in the first opening OP1 and the second opening OP2. By way of example, the first functional layer 222*a* may be arranged or disposed to cover or overlap the first display area DA1 and the second display area DA2 entirely. By way of example, the first functional layer 222*a* may be patterned to correspond to the first opening OP1 and the second opening OP2, arranged or disposed in the first opening OP1 and the second opening OP2, and may not be arranged or disposed in the transmission area TA. By way of example, the first functional layer 222*a* may be arranged or disposed to shield the first display area DA1 entirely and shield the second display area DA2 except for the transmission area TA. Hereinafter, for convenience of description, the case where the first functional layer 222*a* is arranged or disposed to cover or overlap the first display area DA1 and the second display area DA2** entirely is described in detail.

The first functional layer **222*a* may include a single layer or a multi-layer including an organic material. The first functional layer 222*a* may include a hole transport layer (HTL), which has a single-layered structure. By way of example, the first functional layer 222*a* may include a hole injection layer (HIL) and an HTL. The first functional layer 222*a* may be formed as one body to correspond to the main sub-pixels Pm and the auxiliary sub-pixels Pa respectively arranged or disposed in the first display area DA1 and the second display area DA2. Accordingly, the first functional layer 222*a*** may correspond to the transmission area TA.

The second functional layer **222*c* may be arranged or disposed on the main emission layer 222*b* and the auxiliary emission layer 222*b*'. Like the main emission layer 222*b* and the auxiliary emission layer 222*b*', the second functional layer 222*c* may be patterned to correspond to the first opening OP1 and the second opening OP2 and arranged or disposed in the first opening OP1 and the second opening OP2. By way of example, the second functional layer 222*c* may be arranged or disposed to cover or overlap the first display area DA1 and the second display area DA2. By way of example, the second functional layer 222*c* may be patterned to correspond to the first opening OP1 and the second opening OP2, arranged or disposed in the first opening OP1 and the second opening OP2, and may not be arranged or disposed in the transmission area TA. By way of example, the second functional layer 222*c* may be arranged or disposed to shield the first display area DA1 entirely and shield the second display area DA2 except for the transmission area TA. Hereinafter, for convenience of description, the case where the second functional layer 222*c* is arranged or disposed to cover or overlap the first display area DA1 and the second display area DA2** entirely is described in detail.

The second functional layer **222*c* may include a single layer or a multi-layer including an organic material. The second functional layer 222***c* may include an electron transport layer (ETL) and/or an electron injection layer (EIL). The second functional layer 222*c* may be formed as one body to correspond to the main sub-pixels Pm and the auxiliary sub-pixels Pa respectively arranged or disposed in the first display area DA1 and the second display area DA2. Accordingly, the second functional layer 222*c* may correspond to the transmission area TA.

The opposite electrode 223 may be arranged or disposed on the second functional layer 222*c*. The opposite electrode 223 may have a conductive material having a small work function. As an example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. By way of example, the opposite electrode 223 may further include a layer on or under or below the (semi) transparent layer, the layer including ITO, IZO, ZnO, or $In_2O_3$. The opposite electrode 223 may be formed as one body to correspond to the main sub-pixels Pm and the auxiliary sub-pixels Pa respectively arranged or disposed in the first display area DA1 and the second display area DA2.

The layers from the main pixel electrode 221 to the opposite electrode 223 in the first display area DA1 may constitute the main organic light-emitting diode OLED. The layers from the auxiliary pixel electrode 221' to the opposite electrode 223 in the second display area DA2 may constitute the auxiliary organic light-emitting diode OLED'.

An upper layer 250 may be formed on the opposite electrode 223, the upper layer 250 including an organic material. The upper layer 250 may be a layer prepared to protect the opposite electrode 223 and increase a light extraction efficiency. The upper layer 250 may include an organic material having a higher refractive index than that of the opposite electrode 223. By way of example, the upper layer 250 may include stacked layers having different refractive indexes. As an example, the upper layer 250 may include a high refractive index layer or a low refractive index layer or a high refractive index layer that may be stacked each other. A refractive index of the high refractive index layer may be 1.7 or more, and a refractive index of the low refractive index layer may be 1.3 or less.

The upper layer 250 may additionally include lithium fluoride (LiF). By way of example, the upper layer 250 may additionally include an inorganic insulating material such as silicon oxide ($SiO_2$) and silicon nitride ($SiN_x$). By way of example, the upper layer 250 may include an inorganic material.

In an embodiment, the first functional layer 222*a*, the second functional layer 222*c*, the opposite electrode 223, and the upper layer 250 may include an opening area TAH corresponding to the transmission area TA. For example, the first functional layer 222*a*, the second functional layer 222*c*, the opposite electrode 223, and the upper layer 250 may respectively include openings corresponding to the transmission area TA. The openings of the first functional layer 222*a*, the second functional layer 222*c*, the opposite electrode 223, and the upper layer 250 may be formed by a laser. In an embodiment, the widths of the openings constituting the opening area TAH may be substantially the same as each other. As an example, the width of the opening of the opposite electrode 223 may be substantially the same as the width of the opening area TAH.

In an embodiment, the first functional layer 222*a*, the second functional layer 222*c*, the upper layer 250 may be omitted. The opening of the opposite electrode 223 may be the opening area TAH. In an embodiment, at least one of the first functional layer 222*a*, the second functional layer 222*c*, the opposite electrode 223, and the upper layer 250 may be arranged or disposed inside the transmission area TA.

In an embodiment, the inorganic insulating layer IL, the planarization layer 117, and the pixel-defining layer 119 may respectively include a first hole H1, a second hole H2, and a third hole H3.

In case that the opening area TAH corresponds to the transmission area TA, it means that the opening area TAH overlaps the transmission area TA. The area of the opening area TAH may be less than the area of the first hole H1 formed in the inorganic insulating layer IL. For this purpose, it is shown in FIG. 4 that a width Wt of the opening area TAH is less than a width w1 of the first hole H1. Here, the area of the opening area TAH and the area of the first hole H1 may be defined as the area of an opening of a smallest area.

In an embodiment, the first functional layer 222*a*, the second functional layer 222*c*, the opposite electrode 223, and the upper layer 250 may be arranged or disposed on the lateral surfaces of the first hole H1, the second hole H2, and the third hole H3. In an embodiment, the slope of the lateral surfaces of the first hole H1, the second hole H2, and the third hole H3 with respect to the upper surface of the substrate 100 may be gentler than the slope of the lateral surface of the opening area TAH with respect to the upper surface of the substrate 100.

In case that the opening area TAH is formed, it means that members such as the opposite electrode 223, for example, are removed from the transmission area TA. Accordingly, a light transmittance of the transmission area TA may be remarkably increased.

The main organic light-emitting diode OLED and the auxiliary organic light-emitting diode OLED' may be sealed by the encapsulation layer 300. The encapsulation layer 300 may be arranged or disposed on the upper layer 250. The encapsulation layer 300 may prevent external moisture or foreign materials from penetrating into the main organic light-emitting diode OLED and the auxiliary organic light-emitting diode OLED'.

The encapsulation layer 300 may include at least one inorganic layer and at least one organic layer. FIG. 4 shows a structure in which a first inorganic layer 310, an organic layer 320, and a second inorganic layer 330 may be stacked each other. In an embodiment, the number of organic layers and the number of inorganic layers and a stacking order may be variously changed or modified.

The first inorganic layer 310 and the second inorganic layer 330 may include at least one inorganic insulating material including aluminum oxide, titanium oxide, tantalum oxide, hafnium oxide, or zinc oxide, silicon oxide, silicon nitride, and silicon oxynitride and be formed through chemical vapor deposition (CVD). The organic layer 320 may include a polymer-based material. The polymer-based material may include an acryl-based resin, an epoxy-based resin, polyimide, and polyethylene.

The first inorganic layer 310, the organic layer 320, and the second inorganic layer 330 may be formed as one body to cover or overlap the first display area DA1 and the second display area DA2. Accordingly, the first inorganic layer 310, the organic layer 320, and the second inorganic layer 330 may be arranged or disposed inside the opening area TAH.

By way of example, the organic layer 320 may be formed as one body to cover or overlap the first display area DA1 and the second display area DA2 and may not be formed in the transmission area TA. In other words, the organic layer 320 may include an opening corresponding to the transmission area TA. The first inorganic layer 310 may contact the second inorganic layer 330 inside the opening area TAH.

Figure 5:
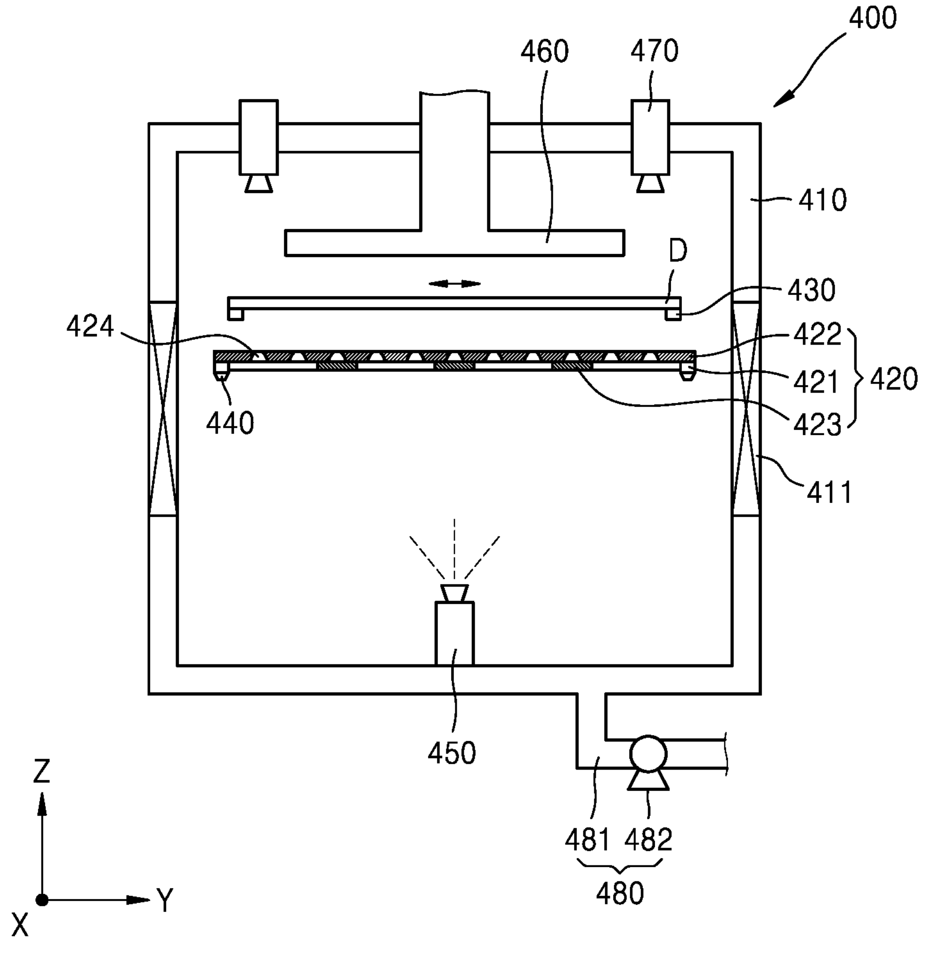
FIG. 5 is a schematic cross-sectional view of an apparatus for manufacturing a display apparatus according to an embodiment.
Figure 6:
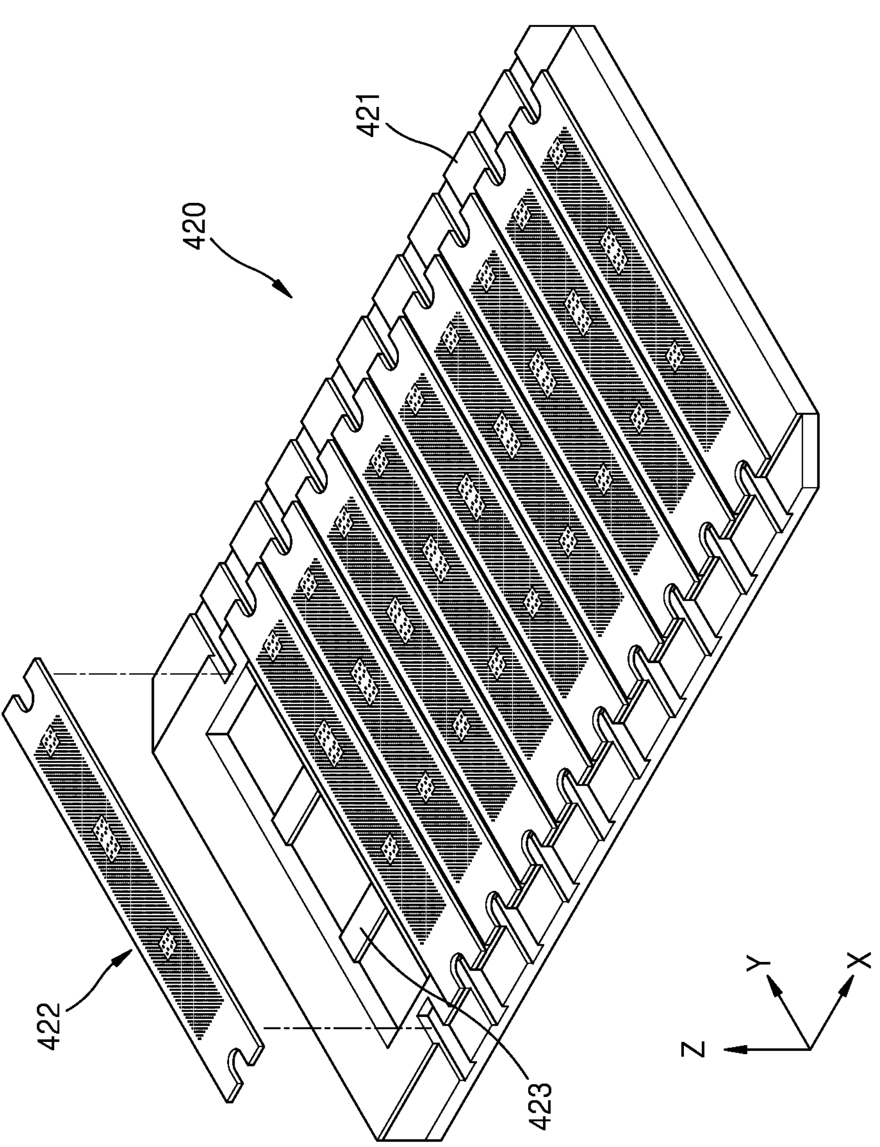
FIG. 6 is a schematic perspective view of a mask assembly shown in FIG. 5.
Figure 7:
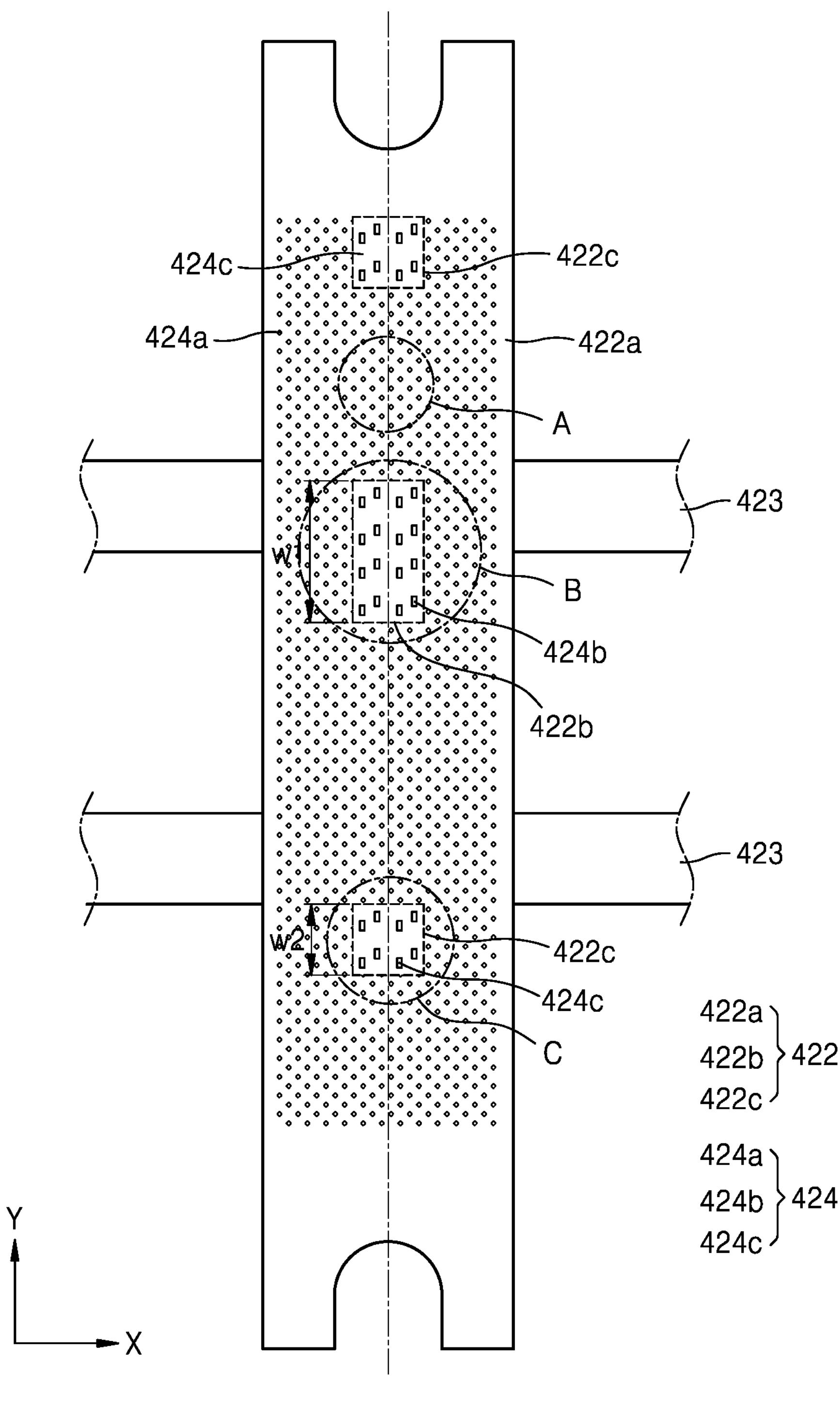
FIG. 7 is a schematic plan view of a mask sheet shown in FIG. 6.

FIG. 5 is a schematic cross-sectional view of an apparatus for manufacturing a display apparatus according to an embodiment, FIG. 6 is a schematic perspective view of a mask assembly shown in FIG. 5, and FIG. 7 is a schematic plan view of a mask sheet shown in FIG. 6.

Referring to FIGS. 5 to 7, the display apparatus 1 may be manufactured through an apparatus 400 for manufacturing a display apparatus.

The apparatus 400 for manufacturing a display apparatus may include a chamber 410, a mask assembly 420, a first support 430, a second support 440, a deposition source 450, a magnetic force generator 460, a vision unit 470, and a pressure adjustor 480.

The chamber 410 may include a space therein. A portion of the chamber 410 may be open. A gate valve 411 may be arranged or disposed on the open portion of the chamber 410 to be opened or closed.

The mask assembly 420 may be arranged or disposed inside of the chamber 410. The mask assembly 420 may include a mask frame 421, a mask sheet 422, and a support frame 423.

The mask frame 421 may include frames connected to each other and include an opening therein. The mask frame 421 may include one opening or openings separated from each other. The mask frame 421 may be formed in a substantially grid shape such as a window frame. Hereinafter, for convenience of description, the case where the mask frame 421 may include one opening in the center thereof is described in detail.

The mask sheet 422 may be fixed to or disposed on the mask frame 421 while the mask sheet 422 is tensioned. The mask sheet 422 may include openings 424 through which deposition materials pass. One mask sheet 422 may be provided or mask sheets 422 may be provided. In the case where one mask sheet 422 is provided, the mask sheet 422 may be arranged or disposed on the mask frame 421 to shield the openings of the mask frame 421. In an embodiment, in the case where mask sheets 422 are provided, the mask sheets 422 may be adjacent to each other along one side or along a side of the mask frame 421 to shield the openings of the mask frame 421. Hereinafter, for convenience of description, the case where the mask sheets 422 are provided is described in detail.

The mask sheet 422 may include openings 424. The openings 424 may include first openings **424*a*, second openings 424*b*, and third openings 424*c***.

The mask sheet 422 may include a first body portion **422*a*, a second body portion 422*b*, and a third body portion 422*c*. In an embodiment, the second body portion 422*b* may be connected to the first body portion 422*a*, and the third body portion 422*c* may be connected to the first body portion 422*a*. For example, the first body portion 422*a*, the second body portion 422*b*, and the third body portion 422*c*** may be provided as one body.

In an embodiment, the first body portion **422*a* may include the first openings 424*a*, the second body portion 422*b* may include the second openings 424*b*, and the third body portion 422*c* may include the third openings 424*c***.

In an embodiment, the shape of the third body portion **422*c* may substantially correspond to the shape of the second display area DA2 (see FIG. 1). As an example, in the case where the second display area DA2 is provided in a substantially quadrangular shape, the third body portion 422*c* may be also provided in a substantially quadrangular shape. However, an embodiment is not limited thereto. By way of example, in the case where the second display area DA2 is provided in a substantially circular shape, the third body portion 422*c* may be also provided in a substantially circular shape. By way of example, in the case where the second display area DA2 is provided in a substantially polygonal shape, the third body portion 422*c* may be also provided in a substantially polygonal shape. Hereinafter, for convenience of description, the case where the shapes of the second display area DA2 and the third body portion 422*c*** are quadrangles is described.

The shape of the second body portion **422*b* may substantially correspond to the shape of the third body portion 422*c*. However, the second body portion 422*b* may be provided in a substantially quadrangular shape that extends in a lengthwise direction (for example, a Y-direction) of the mask sheet 422 from the shape of the third body portion 422*c***. However, an embodiment is not limited thereto.

Figure 8:
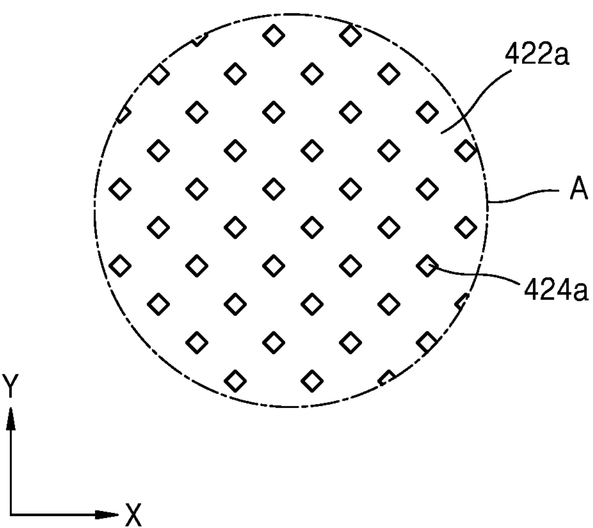
FIG. 8 is an enlarged view of a portion of a mask sheet of an apparatus for manufacturing a display apparatus according to an embodiment, corresponding to region A of FIG. 7.
Figure 9:
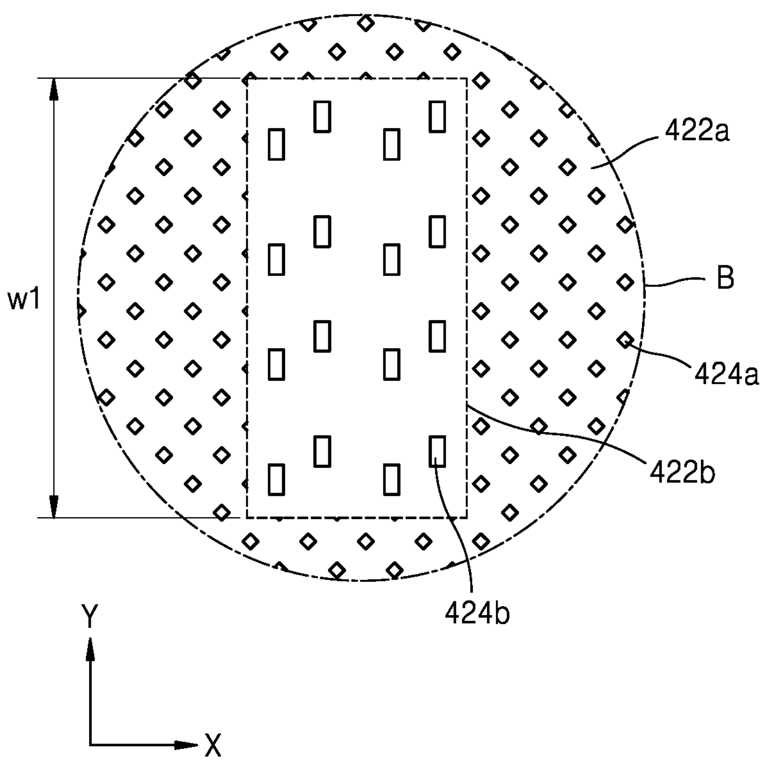
FIG. 9 is an enlarged view of a portion of a mask sheet of an apparatus for manufacturing a display apparatus according to an embodiment, corresponding to region B of FIG. 7.
Figure 10:
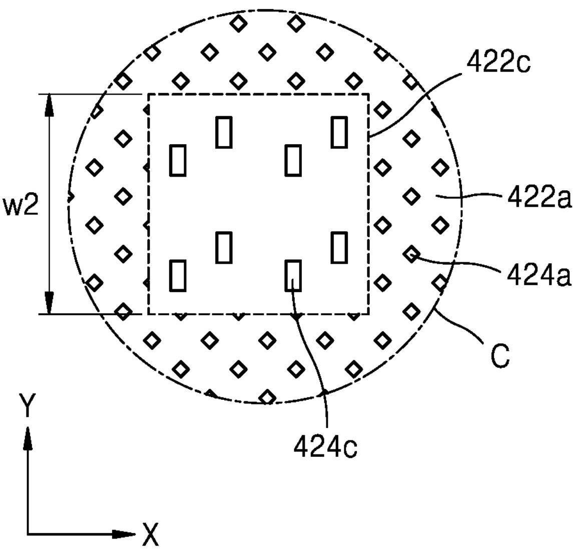
FIG. 10 is an enlarged view of a portion of a mask sheet of an apparatus for manufacturing a display apparatus according to an embodiment, corresponding to region C of FIG. 7.

FIG. 8 is an enlarged view of a portion of a mask sheet of an apparatus for manufacturing a display apparatus according to an embodiment, corresponding to region A of FIG. 7, FIG. 9 is an enlarged view of a portion of a mask sheet of an apparatus for manufacturing a display apparatus according to an embodiment, corresponding to region B of FIG. 7, and FIG. 10 is an enlarged view of a portion of a mask sheet of an apparatus for manufacturing a display apparatus according to an embodiment, corresponding to region C of FIG. 7.

Referring to FIGS. 8 to 10, in an embodiment, the first body portion **422*a* may include the first openings 424*a*, the second body portion 422*b* may include the second openings 424*b*, and the third body portion 422*c* may include the third openings 424*c***.

In an embodiment, the shape of the first openings **424*a* may be different from the shape of the second openings 424*b*. As an example, the planar shape or substantially planar shape of the first openings 424*a* may be a substantially rhombus shape, and the planar shape or substantially planar shape of the second openings 424*b* may be substantially a rectangle or substantially a square. However, an embodiment is not limited thereto. The planar shape or substantially planar shape of the first openings 424*a* and the planar shape or substantially planar shape of the second openings 424*b*** may be provided variously.

In an embodiment, the shape of the second openings **424*b* may be the same as or substantially the same as the shape of the third openings 424*c*. As an example, the planar shape or substantially planar shape of the second openings 424*b* and the planar shape or substantially planar shape of the third openings 424*c* may be rectangles or squares. However, an embodiment is not limited thereto. The planar shape or substantially planar shape of the second openings 424*b* and the planar shape or substantially planar shape of the third openings 424*c*** may be variously provided.

In an embodiment, the planar area of one first opening **424*a* may be different from the planar area of one second opening 424*b*. As an example, the planar area of one first opening 424*a* may be less than the planar area of one second opening 424*b***. However, an embodiment is not limited thereto.

In an embodiment, the planar area of one first opening **424*a* may be different from the planar area of the third opening 424*c*. As an example, the planar area of one first opening 424*a* may be less than the planar area of the third opening 424*c***. However, an embodiment is not limited thereto.

In an embodiment, the planar area of one second opening **424*b* may be the same as the planar area of one third opening 424*c***. However, an embodiment is not limited thereto.

Because the deposition materials are formed in the first display area DA1 (see FIG. 1) of the display apparatus through the first body portion **422*a* of the mask sheet 422, the deposition materials are formed in the second display area DA2 (see FIG. 1) of the display apparatus through the second body portion 422*b* of the mask sheet 422, the first openings 424*a* of the first body portion 422*a* may correspond to the main sub-pixels Pm of the first display area DA1, and the second openings 424*b* of the second body portion 422*b* may correspond to the auxiliary sub-pixels Pa of the second display area DA2. However, as described below, because at least a portion of the second body portion 422*b* overlaps the support frame 423, the second openings 424*b* provided in a portion of the second body portion 422*b* that does not overlap the support frame 423 may correspond to the auxiliary sub-pixels Pa of the second display area DA2**.

Because the deposition materials are formed in the second display area DA2 through the third body portion **422*c* of the mask sheet 422, the third openings 424*c* of the third body portion 422*c* may correspond to the auxiliary sub-pixels Pa of the second display area DA2**.

In an embodiment, the number of first openings **424*a* per unit area of the upper surface of the first body portion 422*a* may be greater than the number of second openings 424*b* per unit area of the upper surface of the second body portion 422*b*. For example, the number of first openings 424*a* may be greater than the number of second openings 424*b*** in a same area. However, an embodiment is not limited thereto.

The unit area may be a reference area for comparison of the number of first openings **424*a* of the upper surface of the first body portion 422*a* to the number of second openings 424*b* of the upper surface of the second body portion 422*b*. For example, the same area (the unit area) may be set in the upper surface of the first body portion 422*a* and a upper surface of the second body portion 422*b*, and the number of first openings 424*a* of the upper surface of the first body portion 422*a* may be compared to the number of second openings 424*b* of the upper surface of the second body portion 422*b***.

In an embodiment, the entire area of the first openings **424*a* per unit area of the upper surface of the first body portion 422*a* may be greater than the entire area of the second openings 424*b* per unit area of the upper surface of the second body portion 422*b*. For example, the entire area of the first openings 424*a* may be greater than the entire area of the second openings 424*b*** in a same area. However, an embodiment is not limited thereto.

In an embodiment, the number of first openings **424*a* per unit area of the upper surface of the first body portion 422*a* may be greater than the number of third openings 424*c* per unit area of the upper surface of the third body portion 422*c*. For example, the entire area of the first openings 424*a* may be greater than the entire area of the third openings 424*c*** in a same area. However, an embodiment is not limited thereto.

In an embodiment, the entire area of the first openings **424*a* per unit area of the upper surface of the first body portion 422*a* may be greater than the entire area of the third openings 424*c* per unit area of the upper surface of the third body portion 422*c*. For example, the entire area of the first openings 424*a* may be greater than the entire area of the third openings 424*c*** in a same area. However, an embodiment is not limited thereto.

In an embodiment, the number of second openings **424*b* per unit area of the upper surface of the second body portion 422*b* may be the same as the number of third openings 424*c* per unit area of the upper surface of the third body portion 422*c*. For example, the number of second openings 424*b* may be the same as the number of third openings 424*c*** in a same area. However, an embodiment is not limited thereto.

In an embodiment, the entire area of the second openings **424*b* per unit area of the upper surface of the second body portion 422*b* may be the same as the entire area of the third openings 424*c* per unit area of the upper surface of the third body portion 422*c*. For example, the entire area of the second openings 424*b* may be greater than the entire area of the third openings 424*c*** in a same area. However, an embodiment is not limited thereto.

In an embodiment, the second body portion **422*b* may have a first width w1 in the lengthwise direction (for example, the Y-direction) of the mask sheet 422, and the third body portion 422*c* may have a second width w2 in the lengthwise direction (for example, the Y-direction) of the mask sheet 422. The first width w1 may be greater than the second width w2. As an example, at least a portion of the second body portion 422*b* may extend in the lengthwise direction (for example, the Y-direction) of the mask sheet 422**.

Referring to FIGS. 5 to 7, the second body portion **422*b* and the third body portion 422*c* may be arranged or disposed on a straight line with respect to a central line CL extending in the lengthwise direction (for example, the Y-direction) of the mask sheet 422**. However, an embodiment is not limited thereto.

Though it is shown in FIG. 7 that one second body portion **422*b* and two third body portions 422*c* are provided, an embodiment is not limited thereto. The second body portion 422*b* and the third body portion 422*c*** may be provided in plural.

The second body portions **422*b* may be apart from each other in the lengthwise direction (for example, the Y-direction) of the mask sheet 422, and the third body portions 422*c* may be apart from each other in the lengthwise direction (for example, the Y-direction) of the mask sheet 422. The second body portion 422*b* may be apart from the third body portion 422*c* in the lengthwise direction (for example, the Y-direction) of the mask sheet 422**.

The support frame 423 may be arranged or disposed in the opening of the mask frame 421, may shield between the mask sheets 422 that are adjacent to each other, or extend in a direction (for example, an X-direction) crossing or intersecting the lengthwise direction of the mask sheet 422.

The support frame 423 arranged or disposed in the direction (for example, an X-direction) crossing or intersecting the lengthwise direction of the mask sheet 422 may overlap at least a portion of the second body portion **422*b*. For example, the support frame 423 may shield at least a portion of the second body portion 422*b*. Therefore, in the second body portion 422*b*, because the second openings 424*b* arranged or disposed at a portion where the second body portion 422*b* overlaps the support frame 423 are shielded by the support frame 423, the deposition materials may not pass through the second openings 424*b* arranged or disposed at the portion where the second body portion 422*b* overlaps the support frame 423**.

In an embodiment, the support frame 423 may overlap the first body portion **422*a*. Therefore, in the first body portion 422*a*, because the first openings 424*a* arranged or disposed at a portion where the first body portion 422*a* overlaps the support frame 423 are shielded by the support frame 423, the deposition materials may not pass through the first openings 424***a* arranged or disposed at the portion where the first body portion 422*a* overlaps the support frame 423.

In the case where there is a region in which the openings are provided and a region in which the openings are not provided inside the mask sheet 422, repulsive force due to magnetic force may be generated at the interface between the region in which the openings are provided and the region in which the openings are not provided. As an example, due to an effective volume step difference between the region in which the openings are provided and the region in which the openings are not provided, repulsive force due to magnetic force may be generated at the interface between the region in which the openings are provided and the region in which the openings are not provided.

In an embodiment, because openings are provided between cells inside the mask sheet 422, repulsive force due magnetic force may be prevented or reduced from occurring at the interface between the region in which the openings are provided and the region in which the openings are not provided. Accordingly, a deposition accuracy may be improved. An opening may be formed between cells inside the mask sheet 422, and the opening formed between the cells is shielded by the support frame 423. Accordingly, deposition materials may not pass through the opening formed between the cells.

In an embodiment, the support frame 423 may not overlap the third body portion 422*c*.

The mask assembly 420 may be manufactured by coupling or connecting the mask sheet 422 and the support frame 423 on the mask frame 421. The mask sheet 422 may be fixed to or disposed on the mask frame 421 through welding while the mask sheet 422 is tensioned.

A display substrate D may be seated on the first support 430. The first support 430 may adjust the position of the display substrate D. As an example, the first support 430 may include a UVW stage.

The mask assembly 420 may be seated on the second support 440. Similar to the first support 430, the second support 440 may adjust the position of the mask assembly 420.

At least one of the first support 430 and the second support 440 may be raised or lowered inside the chamber 410. At least one of the first support 430 and the second support 440 may adjust an interval between the display substrate D and the mask frame 421.

The deposition materials are received in the deposition source 450, and the deposition source 450 may evaporate or sublimate the deposition materials to supply the deposition materials to the chamber 410. The deposition source 450 may include a heater therein and melt or sublimate the deposition materials by heating the deposition materials inside the deposition source 450 during an operation of the heater. The deposition source 450 may be arranged or disposed at the center or the edge of the chamber 410. The deposition source 450 may be provided in plural.

Hereinafter, for convenience of description, the case where one deposition source 450 is arranged or disposed at the center of the chamber 410 is described in detail.

The magnetic force generator 460 may be arranged or disposed in the chamber 410 to closely attach the display substrate D to the mask assembly 420. The magnetic force generator 460 may include an electromagnet or a permanent magnet, for example, that generate magnetic force. As described below, the magnetic force generator 460 may include magnets. This is described with reference to FIG. 11.

The vision unit 470 may be arranged or disposed in the chamber 410 to photograph the positions of the mask assembly 420 and the display substrate D. The vision unit 470 may photograph an alignment mark, for example, of at least one of the mask assembly 420 and the display substrate D.

The pressure adjustor 480 may be connected to the chamber 410 to adjust the inner pressure of the chamber 410. The pressure adjustor 480 may include a connection pipe 481 and a pump 482, the connection pipe 481 being connected to the chamber 410, and the pump 482 being arranged or disposed on the connection pipe 481.

In operation of the apparatus 400 for manufacturing a display apparatus, the display substrate D and the mask assembly 420 may be loaded into the chamber 410. The display substrate D may be a structure in which layers ranging from the buffer layer 111 to the first functional layer 222*a* may be stacked on the substrate 100 in FIG. 4.

The vision unit 470 may photograph the positions of the display substrate D and the mask assembly 420 and adjust the position of at least one of the display substrate D and the mask assembly 420 based on the photographed image, thereby aligning the positions of the display substrate D and the mask assembly 420. The magnetic force generator 460 may closely attach the mask assembly 420 to the display substrate D.

In the case where the deposition source 450 supplies the deposition materials, the deposition materials may pass through the mask assembly 420 and be deposited on the display substrate D. The deposition materials may be deposited on the display substrate D to form the main emission layer 222*b* (see FIG. 4) and the auxiliary emission layer 222*b*' (see FIG. 4). The pressure adjustor 480 may discharge a gas inside the chamber 410 to the outside.

The above processes may be sequentially performed in the apparatus 400 for manufacturing a display apparatus to form blue, red, and green emission layers. A structure may use a different mask assembly 420 according to each emission layer. As an example, to arrange or disposed the blue emission layer on the display substrate D, a mask assembly including a first mask sheet (not shown) may be used, and to arrange or disposed the red emission layer on the display substrate D, a mask assembly including a second mask sheet (not shown) may be used. To arrange or disposed the green emission layer on the display substrate D, a mask assembly including a third mask sheet (not shown) may be used.

The emission layers are formed as described above, and the second functional layer 222*c* (see FIG. 4), the opposite electrode 223 (see FIG. 4), and the encapsulation layer 300 (see FIG. 4) may be sequentially formed, and thus, the display apparatus 1 may be manufactured.

Figure 11:
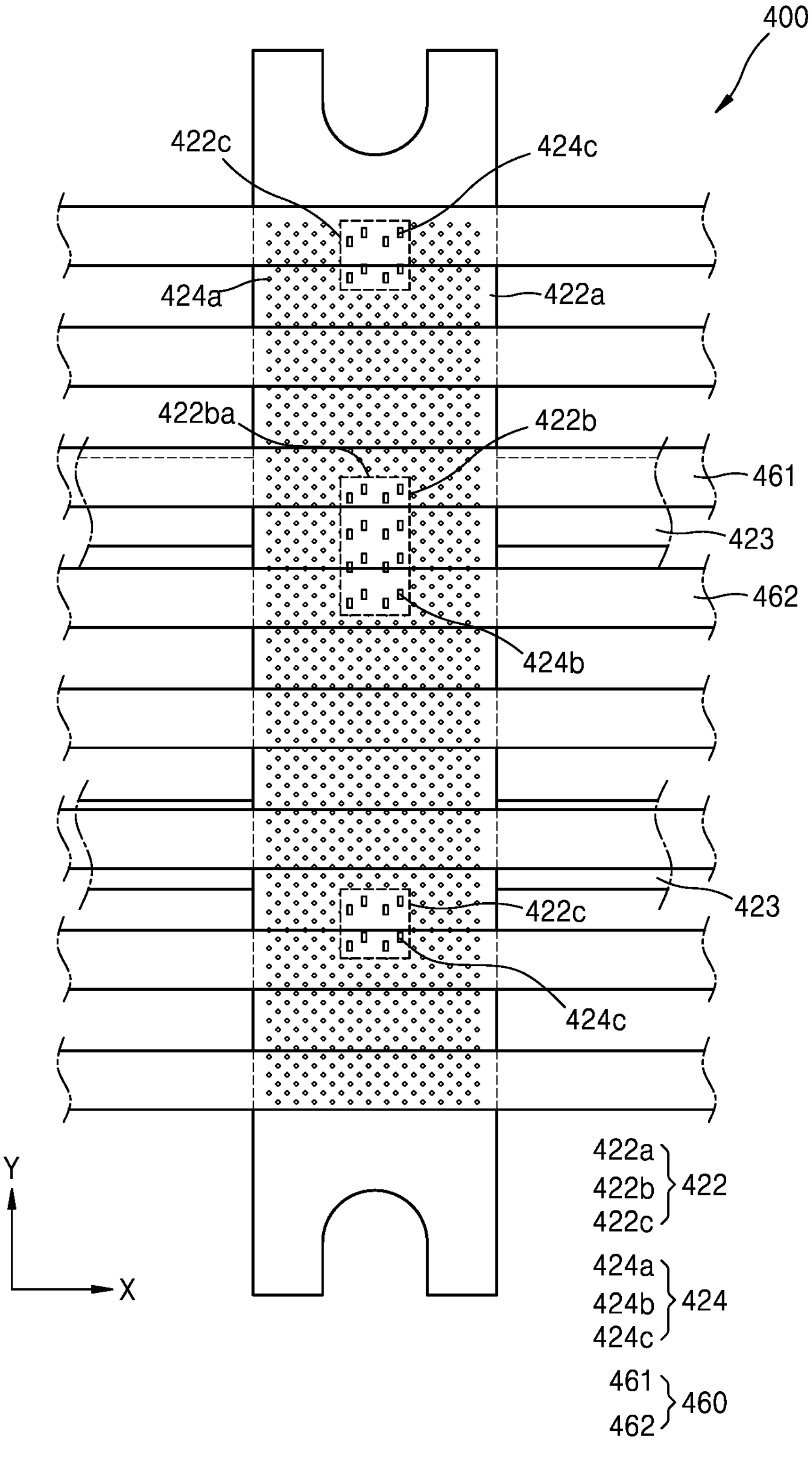
FIG. 11 is a schematic plan view of an apparatus for manufacturing a display apparatus according to an embodiment.

FIG. 11 is a schematic plan view of an apparatus for manufacturing a display apparatus according to an embodiment. FIG. 11 is a schematic plan view showing a structure in which the magnetic force generator 460 is arranged or disposed on the mask sheet 422 of FIG. 7. In FIG. 11, the same reference numerals as those of FIG. 7 denote the same members, and thus, repeated descriptions are omitted. Though the display substrate D is arranged or disposed between the mask sheet 422 and the magnetic force generator 460, the display substrate D may be omitted for convenience of description and illustration.

Referring to FIG. 11, the magnetic force generator 460 may include magnets. The magnets may be apart from each other with a preset interval in the X-direction and/or the Y-direction. In an embodiment, the magnets adjacent to each other may have different polarities. However, an embodiment is not limited thereto.

Though it is shown in FIG. 11 that the magnetic force generator 460 may include eight magnets, an embodiment is not limited thereto. The number of the magnetic force generator 460 may be variously changed.

In an embodiment, the mask sheet 422 may overlap at least some of the magnets of the magnetic force generator 460. For example, the first body portion 422*a*, the second body portion 422*b*, and the third body portion 422*c* of the mask sheet 422 may overlap at least some of the magnets of the magnetic force generator 460.

In an embodiment, the apparatus 400 for manufacturing a display apparatus may include a first magnet 461 and a second magnet 462 facing the mask assembly 420. The first magnet 461 and the second magnet 462 may be apart from each other with a preset interval in the lengthwise direction (for example, the Y-direction) of the mask sheet 422. The first magnet 461 and the second magnet 462 may be magnets that are adjacent to each other in the lengthwise direction (for example, the Y-direction) of the mask sheet 422. In an embodiment, the first magnet 461 and the second magnet 462 may have different polarities. As an example, the first magnet 461 may have an S-polarity, and the second magnet 462 may have an N-polarity. However, an embodiment is not limited thereto. The first magnet 461 may have an N-polarity, and the second magnet 462 may have an S-polarity.

The second body portion 422*b* of the mask sheet 422 may overlap at least a portion of the two magnets. For example, the second body portion 422*b* of the mask sheet 422 may overlap at least a portion of each of the first magnet 461 and the second magnet 462. For example, the second body portion 422*b* may overlap at least a portion of the first magnet 461 and overlap at least a portion of the second magnet 462.

In a plan view, in the case where an upper portion 422*ba* of the second body portion 422*b* is arranged or disposed adjacent to the edge of the magnet, repulsive force by magnetic force may be generated due to an effective volume step difference between the second body portion 422*b* and the first body portion 422*a* adjacent to the upper portion 422*ba* of the second body portion 422*b*. Due to this repulsive forced, a deposition accuracy may be lowered.

In an embodiment, because at least a portion of the second body portion 422*b* extends in the lengthwise direction (for example the Y-direction) of the mask sheet 422, the upper portion 422*ba* of the second body portion 422*b* may be prevented or reduced from being arranged or disposed adjacent to the edge of the magnet. Because the upper portion 422*ba* of the second body portion 422*b* is prevented or reduced from being arranged or disposed adjacent to the edge of the magnet, repulsive force by magnetic force may be prevented or reduced from occurring, and thus, the deposition accuracy may be improved while the display apparatus is manufactured. For example, because at least a portion of the second body portion 422*b* extends in the lengthwise direction (for example the Y-direction) of the mask sheet 422, and the second body portion 422*b* overlaps at least two magnets (for example, the first magnet 461 and the second magnet 462), the upper portion 422*ba* of the second body portion 422*b* may be prevented or reduced from being arranged or disposed adjacent to the edge of the magnet, and thus, the emission layers 222*b* and 222*b*' may be formed in a precise pattern on the display substrate D.

In an embodiment, the first magnet 461 and/or the second magnet 462 may overlap at least a portion of the support frame 423.

In an embodiment, the third body portion 422*c* of the mask sheet 422 may overlap at least a portion of one magnet. For example, one third body portion 422*c* may overlap at least a portion of one magnet.

According to an embodiment, a display apparatus having a precise pattern may be manufactured. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure and as defined by the following claims.

What is claimed is:

1. An apparatus for manufacturing a display apparatus, the apparatus comprising:
- a mask assembly; and
- a first magnet and a second magnet facing the mask assembly, wherein
- the mask assembly includes:
  - a mask frame; and
  - a mask sheet disposed on the mask frame,
- the mask sheet includes:
  - a first body portion including first openings;
  - a second body portion connected to the first body portion and including second openings; and
  - a third body portion connected to the first body portion and including third openings,
- the second body portion overlaps at least a portion of the first magnet and the second magnet,
- the second body portion has a first width in the lengthwise direction of the mask sheet,
- the third body portion has a second width in the lengthwise direction of the mask sheet that is less than the first width of the second body portion,
- the first body portion entirely surrounds the second body portion, and
- a number of the first openings of the first body portion per unit area of an upper surface of the first body portion is greater than a number of the second openings of the second body portion per unit area of an upper surface of the second body portion.

2. The apparatus for manufacturing the display apparatus of claim 1, wherein the first magnet is spaced apart from the second magnet in a lengthwise direction of the mask sheet.

3. The apparatus for manufacturing the display apparatus of claim 2, wherein the mask assembly includes a support frame extending in a direction intersecting the lengthwise direction of the mask sheet, the support frame supporting the mask sheet.

4. The apparatus for manufacturing the display apparatus of claim 3, wherein the second body portion overlaps at least a portion of the support frame in a plan view.

5. The apparatus for manufacturing the display apparatus of claim 4, wherein areas of the first openings are different from areas of the second openings in a plan view.

6. The apparatus for manufacturing the display apparatus of claim 4, wherein the third body portion does not overlap the support frame.

7. The apparatus for manufacturing the display apparatus of claim 1, wherein a number of the third openings of the third body portion per unit area of an upper surface of the third body portion is equal to a number of second openings of the second body portion per unit area of an upper surface of the second body portion.

8. The apparatus for manufacturing the display apparatus of claim 1, wherein the second body portion and the third body portion are disposed on a straight line.

9. A mask assembly comprising:

a mask frame;

a mask sheet disposed on the mask frame; and a support frame extending in a direction intersecting a lengthwise direction of the mask sheet, the support frame supporting the mask sheet, wherein the mask sheet includes:

a first body portion including first openings; and a second body portion connected to the first body portion and including second openings; and a third body portion connected to the first body portion and including third openings, and the second body portion overlaps at least a portion of the support frame in a plan view, the second body portion has a first width in the lengthwise direction of the mask sheet, the third body portion has a second width in the lengthwise direction of the mask sheet that is less than the first width of the second body portion, the first body portion entirely surrounds the second body portion, and a number of the first openings of the first body portion per unit area of an upper surface of the first body portion is greater than a number of the second openings of the second body portion per unit area of an upper surface of the second body portion.

10. The mask assembly of claim 9, wherein areas of the first openings are different from areas of the second openings in a plan view.

11. The mask assembly of claim 9, wherein the third body portion does not overlap the support frame in a plan view.

12. The apparatus for manufacturing the display apparatus of claim 1, wherein the first body portion surrounds at least a portion of the third body portion.

13. The mask assembly of claim 9, wherein the first body portion surrounds at least a portion of the third body portion.

* * * * *